United States Patent
Toyota

(10) Patent No.: US 9,473,104 B2
(45) Date of Patent: Oct. 18, 2016

(54) SURFACE ACOUSTIC WAVE FILTER

(71) Applicant: Murata Manufacturing Co., Ltd., Nagaokakyo-shi, Kyoto-fu (JP)

(72) Inventor: Yuji Toyota, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 18 days.

(21) Appl. No.: 14/541,242

(22) Filed: Nov. 14, 2014

(65) Prior Publication Data
US 2015/0155853 A1    Jun. 4, 2015

(30) Foreign Application Priority Data

Nov. 29, 2013  (JP) ................. 2013-247748

(51) Int. Cl.
*H03H 9/64* (2006.01)
*H03H 9/02* (2006.01)
*H03H 9/05* (2006.01)

(52) U.S. Cl.
CPC ..... *H03H 9/02992* (2013.01); *H03H 9/02897* (2013.01); *H03H 9/6469* (2013.01)

(58) Field of Classification Search
CPC .............................. H03H 9/64; H03H 9/058
USPC ................. 333/193, 195; 310/313 R
See application file for complete search history.

(56) References Cited

U.S. PATENT DOCUMENTS

| | | | |
|---|---|---|---|
| 7,283,016 B2 * | 10/2007 | Haruta | H03H 9/0071 333/133 |
| 7,295,089 B2 * | 11/2007 | Shibahara | H03H 9/0038 310/313 B |
| 7,479,852 B2 * | 1/2009 | Takamine | H03H 3/10 29/25.35 |
| 7,486,159 B2 * | 2/2009 | Fujii | H03H 9/0057 333/193 |
| 7,911,116 B2 * | 3/2011 | Aikawa | H03H 3/02 29/25.35 |
| 2004/0196119 A1 | 10/2004 | Shibahara et al. | |
| 2012/0279795 A1 | 11/2012 | Furukawa et al. | |

FOREIGN PATENT DOCUMENTS

| | | |
|---|---|---|
| JP | 63-299143 A | 12/1988 |
| JP | 11-186381 A | 7/1999 |
| JP | 2004-282707 A | 10/2004 |
| JP | 2007-259430 A | 10/2007 |
| JP | 5166053 | 3/2013 |
| WO | 2011/089906 A1 | 7/2011 |

OTHER PUBLICATIONS

Official Communication issued in corresponding Japanese Patent Application No. 2013-247748, mailed on Oct. 13, 2015.

* cited by examiner

*Primary Examiner* — Dean Takaoka
(74) *Attorney, Agent, or Firm* — Keating & Bennett, LLP

(57) ABSTRACT

A surface acoustic wave filter includes a piezoelectric substrate, a lower-layer wiring line, an upper-layer wiring line, and an interlayer insulating film. The lower-layer wiring line is disposed on the piezoelectric substrate. The upper-layer wiring line crosses the lower-layer wiring line. The upper-layer wiring line has a potential that is different from the potential of the lower-layer wiring line. The interlayer insulating film is disposed between the lower-layer wiring line and the upper-layer wiring line. The interlayer insulating film has a portion that has a width that is not greater than the width of the upper-layer wiring line in a cross-sectional view taken along a direction in which the lower-layer wiring line extends.

17 Claims, 4 Drawing Sheets

SURFACE ACOUSTIC WAVE FILTER

BACKGROUND OF THE INVENTION

1. Field of the Invention

The present invention relates to surface acoustic wave filters, and more particularly to a surface acoustic wave filter that has a structure in which a lower-layer wiring line and an upper-layer wiring line three-dimensionally cross each other.

2. Description of the Related Art

Japanese Unexamined Patent Application Publication No. 2004-282707 discloses an example of a surface acoustic wave filter of the related art. Japanese Unexamined Patent Application Publication No. 2004-282707 discloses a configuration in which a lower-layer wiring line and an upper-layer wiring line that have different potentials cross each other without being electrically connected to each other by interposing an interlayer insulating film therebetween.

FIG. 9 and FIG. 17B of Japanese Unexamined Patent Application Publication No. 2004-282707 illustrate a configuration in which the width of an interlayer insulating film is greater than a line width of an upper-layer wiring line. As illustrated in FIG. 10 of the present application, which is FIG. 9 of Japanese Unexamined Patent Application Publication No. 2004-282707, in the case where the area of an interlayer insulating film is increased, a parasitic capacitance that is generated between the lower-layer wiring line and the upper-layer wiring line in an area in which the lower-layer and upper-layer wiring lines three-dimensionally cross each other increases. There has been a problem in that characteristics of a surface acoustic wave filter deteriorate when an undesirable signal leaks out to the lower-layer wiring line from the upper-layer wiring line through the parasitic capacitance.

SUMMARY OF THE INVENTION

Accordingly, preferred embodiments of the present invention provide a surface acoustic wave filter capable of reducing a parasitic capacitance that is generated between a lower-layer wiring line and an upper-layer wiring line.

According to a preferred embodiment of the present invention, a surface acoustic wave filter includes a piezoelectric substrate, a lower-layer wiring line, an upper-layer wiring line, and an interlayer insulating film. The lower-layer wiring line is disposed on the piezoelectric substrate. The upper-layer wiring line crosses the lower-layer wiring line. The upper-layer wiring line has a potential that is different from a potential of the lower-layer wiring line. The interlayer insulating film is disposed between the lower-layer wiring line and the upper-layer wiring line. The interlayer insulating film has a portion that has a width that is not greater than a width of the upper-layer wiring line in a cross-sectional view taken along a direction in which the lower-layer wiring line extends.

In the surface acoustic wave filter, it is preferable that the entire interlayer insulating film have a width that is not greater than the width of the upper-layer wiring line in the cross-sectional view taken along the direction in which the lower-layer wiring line extends.

In the surface acoustic wave filter, it is preferable that the interlayer insulating film include a top surface that is in contact with the upper-layer wiring line and a bottom surface that is in contact with the lower-layer wiring line. It is preferable that the top surface have a width that is smaller than the width of the upper-layer wiring line in the cross-sectional view taken along the direction in which the lower-layer wiring line extends.

In the surface acoustic wave filter, it is preferable that the bottom surface have a width that is larger than the width of the top surface in the cross-sectional view taken along the direction in which the lower-layer wiring line extends.

In the surface acoustic wave filter, it is preferable that the bottom surface have a width that is smaller than the width of the upper-layer wiring line in the cross-sectional view taken along the direction in which the lower-layer wiring line extends.

In the surface acoustic wave filter, it is preferable that the interlayer insulating film include the top surface that is in contact with the upper-layer wiring line and the bottom surface that is in contact with the lower-layer wiring line. It is preferable that the top surface have a width that is larger than the width of the bottom surface in the cross-sectional view taken along the direction in which the lower-layer wiring line extends.

According to the surface acoustic wave filters of various preferred embodiments of the present invention, a parasitic capacitance that is generated between a lower-layer wiring line and an upper-layer wiring line are reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
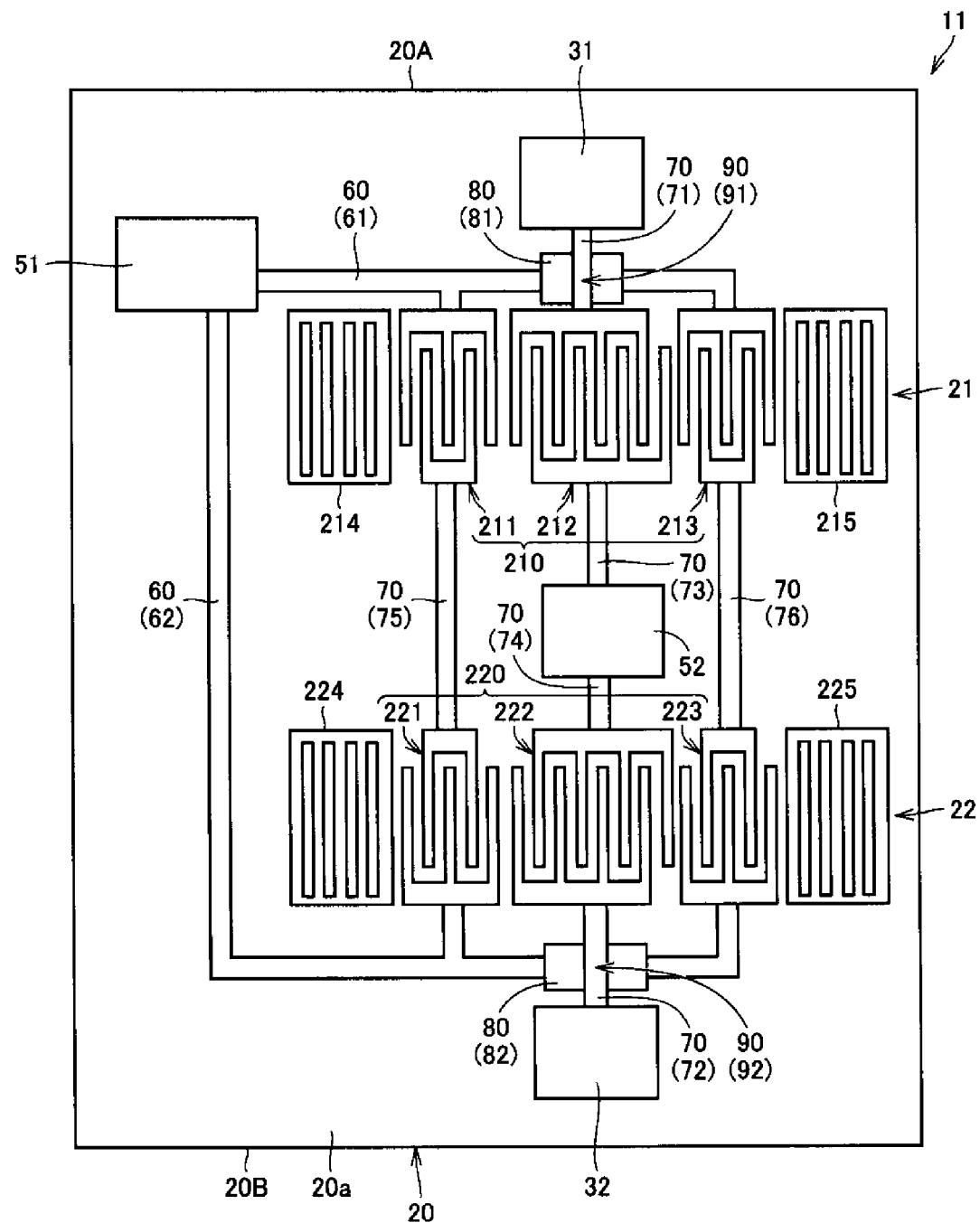
FIG. 1 is a plan view illustrating a surface acoustic wave filter of a first preferred embodiment of the present invention.

Preferred embodiments of the present invention will be described below with reference to the drawings. Note that, in the drawings, portions that are the same as each other or that correspond to each other are denoted by the same reference numerals, and descriptions thereof will not be repeated.

First Preferred Embodiment

FIG. 1 is a plan view illustrating a surface acoustic wave filter 11 of a first preferred embodiment of the present invention. As illustrated in FIG. 1, the surface acoustic wave filter 11 includes a piezoelectric substrate 20. The piezoelectric substrate 20 preferably has the shape of a rectangular or substantially rectangular plate and includes a surface 20a that is a major surface and two opposing ends 20A and 20B. The piezoelectric substrate 20 can be, for example, a LiTaO$_3$ substrate, a LiNbO$_3$ substrate, a quartz substrate, or the like. In the following preferred embodiment, the case where the piezoelectric substrate 20 preferably is a LiTaO$_3$ substrate will be described.

A first elastic wave filter 21 and a second elastic wave filter 22 are disposed on the surface 20a of the piezoelectric substrate 20. The first elastic wave filter 21 is disposed on the side on which the end 20A of the piezoelectric substrate 20 is present. The second elastic wave filter 22 is disposed on the side on which the end 20B of the piezoelectric substrate 20 is present. In addition, an input pad electrode 31, an output pad electrode 32, and ground electrodes 51 and 52 are disposed on the surface 20a of the piezoelectric substrate 20.

The first elastic wave filter 21 includes an interdigital transducer (IDT) group 210 and reflectors 214 and 215. The IDT group 210 includes a plurality of IDTs 211, 212, 213. The IDT 211 is disposed on a first side of the propagation direction of a surface acoustic wave. The IDT 213 is disposed on a second side of the propagation direction of a surface acoustic wave. The IDT 212 is interposed between the IDT 211 and the IDT 213. Each of the IDTs 211 to 213 includes a pair of comb-shaped electrodes that are arranged so as to face each other in such a manner that each of electrode fingers of one of the comb-shaped electrodes is adjacent to a corresponding one of electrode fingers of the other one of the comb-shaped electrodes.

The reflector 214 is disposed on a first side of the IDT group 210 in the propagation direction of a surface acoustic wave. The reflector 215 is disposed on a second side of the IDT group 210 in the propagation direction of a surface acoustic wave. The first elastic wave filter 21 is formed preferably by arranging the reflector 214, the IDT 211, the IDT 212, the IDT 213, and the reflector 215 in this order along the propagation direction of a surface acoustic wave. The first elastic wave filter 21 preferably is a 3IDT longitudinally coupled resonator-type surface acoustic wave filter.

The second elastic wave filter 22 includes an IDT group 220 and reflectors 224 and 225. The IDT group 220 includes a plurality of IDTs 221, 222, 223. The IDT 221 is disposed on a first side of the propagation direction of a surface acoustic wave. The IDT 223 is disposed on a second side of the propagation direction of a surface acoustic wave. The IDT 222 is interposed between the IDT 211 and the IDT 213. Each of the IDTs 221 to 223 includes a pair of comb-shaped electrodes that are arranged so as to face each other in such a manner that each of electrode fingers of one of the comb-shaped electrodes is adjacent to a corresponding one of electrode fingers of the other one of the comb-shaped electrodes.

The reflector 224 is disposed on a first side of the IDT group 220 in the propagation direction of a surface acoustic wave. The reflector 225 is disposed on a second side of the IDT group 220 in the propagation direction of a surface acoustic wave. The second elastic wave filter 22 is formed preferably by arranging the reflector 224, the IDT 221, the IDT 222, the IDT 223, and the reflector 225 in this order along the propagation direction of a surface acoustic wave. The second elastic wave filter 22 preferably is a 3IDT longitudinally coupled resonator-type surface acoustic wave filter.

The input pad electrode 31 and the first elastic wave filter 21 are connected by an input signal wiring line 71. The input signal wiring line 71 electrically connects the input pad electrode 31 and one of the comb-shaped electrodes of the IDT 212 on the side on which the end 20A is present. The output pad electrode 32 and the second elastic wave filter 22 are connected by an output signal wiring line 72. The output signal wiring line 72 electrically connects the output pad electrode 32 and one of the comb-shaped electrodes of the IDT 222 on the side on which the end 20B is present.

The ground electrode 51 and the first elastic wave filter 21 are connected by a ground wiring line 61. The ground wiring line 61 electrically connects the ground electrode 51 and one of the comb-shaped electrodes of each of the IDTs 211 and 213 on the side on which the end 20A is present. The ground electrode 51 and the second elastic wave filter 22 are connected by a ground wiring line 62. The ground wiring line 62 electrically connects the ground electrode 51 and one of the comb-shaped electrodes of each of the IDTs 221 and 223 on the side on which the end 20B is present.

The ground electrode 52 and the first elastic wave filter 21 are connected by a ground wiring line 73. The ground wiring line 73 electrically connects the ground electrode 52 and one of the comb-shaped electrodes of the IDT 212 on the side on which the end 20B is present. The ground electrode 52 and the second elastic wave filter 22 are connected by a ground wiring line 74. The ground wiring line 74 electrically connects the ground electrode 52 and one of the comb-shaped electrodes of the IDT 222 on the side on which the end 20A is present.

The first elastic wave filter 21 and the second elastic wave filter 22 are connected in cascade by interstage connection wiring lines 75 and 76. The interstage connection wiring line 75 electrically connects one of the comb-shaped electrodes of the IDT 211 on the side on which the end 20B is present and one of the comb-shaped electrodes of the IDT 221 on the side on which the end 20A is present. The interstage connection wiring line 76 electrically connects one of the comb-shaped electrodes of the IDT 213 on the side on which the end 20B is present and one of the comb-shaped electrodes of the IDT 223 on the side on which the end 20A is present.

The ground wiring lines 61 and 62 define a lower-layer wiring line 60. The lower-layer wiring line 60 is disposed on a surface of the piezoelectric substrate 20. The input signal wiring line 71, the output signal wiring line 72, the ground wiring lines 73 and 74, and the interstage connection wiring lines 75 and 76 define an upper-layer wiring line 70. The upper-layer wiring line 70 is arranged above the lower-layer wiring line 60 in such a manner that portions of the upper-layer wiring line 70 cross the lower-layer wiring line 60, and that interlayer insulating films 80 are each interposed between one of the portions of the upper-layer wiring line 70 and the lower-layer wiring line 60. In the upper-layer wiring line 70, the portions of the upper-layer wiring line 70 which are located on a corresponding one of the interlayer insulating films 80 are not directly in contact with the piezoelectric substrate 20, that is, the portions of the upper-layer wiring line 70 and the piezoelectric substrate 20 are isolated from each other.

In the example illustrated in FIG. 1, the surface acoustic wave filter 11 includes two three-dimensional crossing areas 90. In a first three-dimensional crossing area 91, the ground wiring line 61 that has been connected to the ground electrode 51 and the input signal wiring line 71 that has been connected to the input pad electrode 31 three-dimensionally cross each other. In a second three-dimensional crossing area 92, the ground wiring line 62 that has been connected to the ground electrode 51 and the output signal wiring line 72 that has been connected to the output pad electrode 32 three-dimensionally cross each other.

In the first three-dimensional crossing area 91, the ground wiring line 61 extends along the end 20A of the piezoelectric substrate 20, and the input signal wiring line 71 extends along a direction perpendicular or substantially perpendicular to the end 20A. In the first three-dimensional crossing area 91, the ground wiring line 61 that has been disposed on the surface 20a of the piezoelectric substrate 20 and the input signal wiring line 71 that has a potential different from that of the ground wiring line 61 are perpendicular or substantially perpendicular to each other. An interlayer insulating film 81 is interposed between the ground wiring line 61 and the input signal wiring line 71 in a thickness direction of the piezoelectric substrate 20.

In the second three-dimensional crossing area 92, the ground wiring line 62 extends along the end 20B of the piezoelectric substrate 20, and the output signal wiring line 72 extends along a direction perpendicular or substantially perpendicular to the end 20B. In the second three-dimensional crossing area 92, the ground wiring line 62 that has been disposed on the surface 20a of the piezoelectric substrate 20 and the output signal wiring line 72 that has a potential different from that of the ground wiring line 62 are perpendicular or substantially perpendicular to each other. An interlayer insulating film 82 is interposed between the ground wiring line and the output signal wiring line 72 in the thickness direction of the piezoelectric substrate 20.

Figure 2:
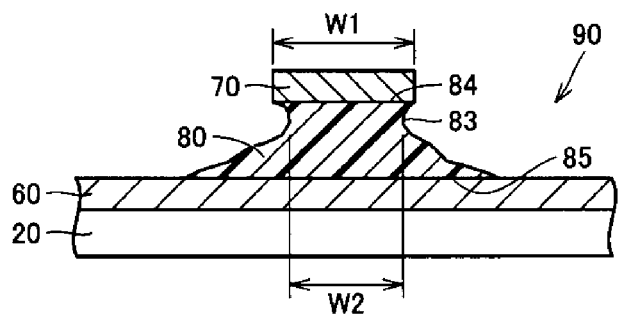
FIG. 2 is a sectional view of a three-dimensional crossing area in the surface acoustic wave filter illustrated in FIG. 1 taken along a direction in which a lower-layer wiring line extends.
Figure 3:
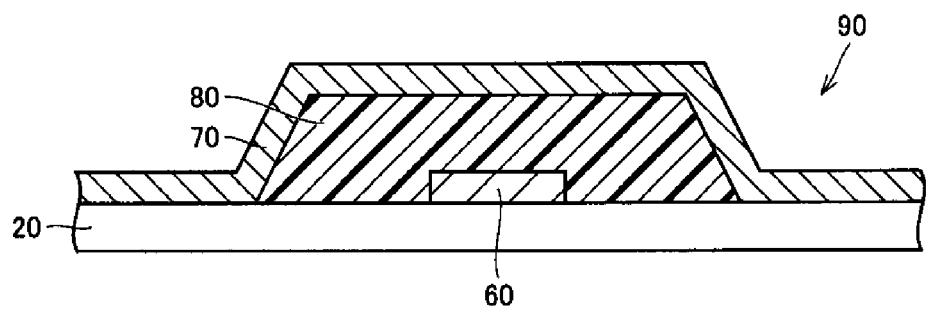
FIG. 3 is a sectional view of the three-dimensional crossing area in the surface acoustic wave filter illustrated in FIG. 1 taken along a direction in which an upper-layer wiring line extends.

FIG. 2 is a sectional view of one of the three-dimensional crossing areas 90 in the surface acoustic wave filter illustrated in FIG. 1 taken along a direction in which the lower-layer wiring line 60 extends. The sectional view of the lower-layer wiring line 60 illustrated in FIG. 2 is obtained from the cross section of the lower-layer wiring line 60, which is obtained by cutting the lower-layer wiring line 60 along a plane containing the direction in which the lower-layer wiring line 60 extends and a direction normal to the surface 20a of the piezoelectric substrate 20. FIG. 3 is a sectional view of one of the three-dimensional crossing areas 90 in the surface acoustic wave filter 11 illustrated in FIG. 1 taken along a direction in which the upper-layer wiring line 70 extends.

In the cross-sectional view taken along the direction in which the upper-layer wiring line 70 extends, which is illustrated in FIG. 3, the interlayer insulating film 80 is arranged so as to cover the lower-layer wiring line 60, and the external shape of the interlayer insulating film 80 preferably is a trapezoidal or substantially trapezoidal shape. The interlayer insulating film 80 has a substantially tapered inclined surface in order to significantly reduce or prevent the occurrence of breaking of the upper-layer wiring line 70.

On the other hand, as illustrated in FIG. 2, the interlayer insulating film 80 preferably has a shape in which a portion of the interlayer insulating film 80 is substantially constricted in a line width direction (the left-right direction in FIG. 2) of the upper-layer wiring line 70 that extends in a direction perpendicular or substantially perpendicular to FIG. 2. In the portion of the interlayer insulating film 80, which is substantially constricted, a width W2 of a deepest portion 83 is smaller than a width W1 of the upper-layer wiring line 70.

In the cross-sectional view taken along the direction in which the lower-layer wiring line 60 extends, which is illustrated in FIG. 2, the interlayer insulating film 80 includes a portion that has the width W2, which is smaller than the width W1 of the upper-layer wiring line 70 and a portion that has a width that is greater than the width W1 of the upper-layer wiring line 70. In the interlayer insulating film 80, the portion, which has the width that is greater than the width W1 of the upper-layer wiring line 70, projects out from the upper-layer wiring line 70 when the three-dimensional crossing area 90 is seen in plan view. As illustrated in FIG. 2, the portion of the interlayer insulating film 80, which projects out from the upper-layer wiring line 70 when seen in plan view, has a thickness that is smaller than the distance between the upper-layer wiring line 70 and the lower-layer wiring line 60 in the thickness direction of the piezoelectric substrate 20.

The width of the interlayer insulating film 80 is reduced in the vicinity of the three-dimensional crossing area 90, and as a result, a portion of the interlayer insulating film 80 is replaced by air. In a region of the width W1 of the upper-layer wiring line 70, an air space that has a dielectric constant that is smaller than that of the interlayer insulating film 80 is defined between the lower-layer wiring line 60 and the upper-layer wiring line 70, and the lower-layer wiring line 60 and the upper-layer wiring line 70 face each other and cross each other with the air space defined therebetween. As a result, the value of a parasitic capacitance between the lower-layer wiring line 60 and the upper-layer wiring line 70 is reduced compared with the case where the area between the lower-layer wiring line 60 and the upper-layer wiring line 70 is completely filled with the interlayer insulating film 80.

In the three-dimensional crossing area 90, the upper-layer wiring line 70 that is positioned above the lower-layer wiring line 60 is supported by the interlayer insulating film 80 from below. The interlayer insulating film 80 defines and functions as a support that supports the upper-layer wiring line 70 in the three-dimensional crossing area 90.

Therefore, in the surface acoustic wave filter 11 of the first preferred embodiment, deterioration of attenuation characteristics outside a pass band is prevented by reducing a parasitic capacitance value without impairing the strength of each of the three-dimensional crossing areas 90 as a structure. By using a configuration in which the interlayer insulating films 80 are present in all of the regions that are superposed with the upper-layer wiring line 70 when the three-dimensional crossing areas 90 are seen in plan view, the strength of each of the three-dimensional crossing areas 90 is further improved, and the shapes of the three-dimensional crossing areas 90 are further stabilized.

A non-limiting example of a process of manufacturing the surface acoustic wave filter 11 of the first preferred embodiment will now be described mainly focusing on formation of the three-dimensional crossing areas 90.

First, a 42° Y-cut LiTaO₃ substrate is prepared as the piezoelectric substrate 20. The surface 20a of the piezoelectric substrate 20 has undergone mirror polishing in advance.

A mask pattern is formed on the surface 20a of the piezoelectric substrate 20 by applying, exposing, and developing a resist, and an Al film and a Cu film are deposited in this order. After that, the first elastic wave filter 21, the second elastic wave filter 22, and the lower-layer wiring line 60 are formed by a lift-off method, which is a method of removing the mask pattern and the Al and Cu films on the mask pattern. Alternatively, a dry etching method in which a resist pattern is formed on the Al and Cu films, which have been deposited on the surface 20a of the piezoelectric substrate 20, the Al and Cu films are processed in accordance with the resist pattern, and after that, the resist pattern, which is no longer necessary, is removed may be used.

Next, the interlayer insulating film 80 that contains, as a main component, a polyimide is formed on a portion of the lower-layer wiring line 60 that is desired to three-dimensionally cross the upper-layer wiring line 70. The interlayer insulating film 80 is formed by performing photolithography using a photosensitive polyimide.

Subsequently, the upper-layer wiring line 70 that is formed of a Ti and Al multilayer film is formed by using the above-mentioned lift-off method. A novolac-based resin is used as a resist, and the Ti film and the Al film are deposited by evaporation. In this case, a portion of the upper-layer wiring line 70 is formed so as to extend on the interlayer insulating film 80 and cross the lower-layer wiring line 60. The line width of the upper-layer wiring line 70 in this case is set to be smaller than the width of the interlayer insulating film 80.

Next, the interlayer insulating film 80 is immersed into an organic polyimide developing solution in such a manner as to reduce the thickness of a polyimide film, which is the interlayer insulating film 80, by a certain amount. In this case, the upper-layer wiring line 70 serves as a mask, and only the thickness of a portion of the polyimide film, which has been exposed, is reduced by a wet etching method. After that, the polyimide film is hardened by performing a heat treatment on the polyimide film under a condition of about 300° C. for about one hour.

As a result, the three-dimensional crossing area 90, which is illustrated in FIGS. 2 and 3 and in which the lower-layer wiring line 60 and the upper-layer wiring line 70 three-dimensionally cross each other with the interlayer insulating film 80 interposed therebetween, is formed. Performing the process of reducing the thickness of the interlayer insulating film 80 allows the interlayer insulating film 80 to have a substantially constricted shape as illustrated in FIG. 2 and allows the interlayer insulating film 80 to be formed so as to have a shape in which the width W2 of the deepest portion 83 in the substantially constricted shape is smaller than the width W1 of the upper-layer wiring line 70. The substantially constricted shape is formed by wet etching, and thus, the interlayer insulating film 80 that has a shape in which the width W2 of the interlayer insulating film 80 is smaller than the width W1 of the upper-layer wiring line 70 can be manufactured at low cost. A portion on the interlayer insulating film 80 is removed after the upper-layer wiring line 70 has been formed, so that a problem of positional deviation of the upper-layer wiring line 70 with respect to the interlayer insulating film 80 is prevented from occurring, and a desired structure is consistently obtained.

Second Preferred Embodiment

Figure 4:
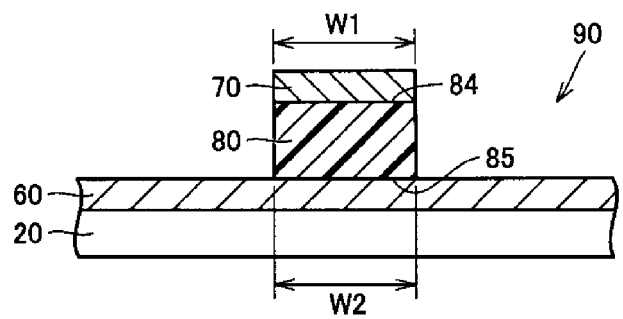
FIG. 4 is a sectional view of a three-dimensional crossing area in a surface acoustic wave filter of a second preferred embodiment of the present invention taken along a direction in which a lower-layer wiring line extends.
Figure 5:
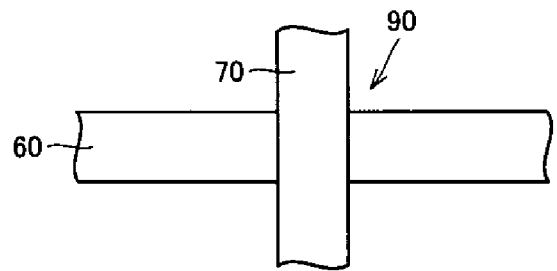
FIG. 5 is a plan view of the three-dimensional crossing area illustrated in FIG. 4.

FIG. 4 is a sectional view of one of three-dimensional crossing areas 90 in a surface acoustic wave filter 11 of a second preferred embodiment of the present invention taken along a direction in which a lower-layer wiring line 60 extends. FIG. 5 is a plan view of the three-dimensional crossing area 90 illustrated in FIG. 4. Interlayer insulating films 80 of the second preferred embodiment each have a fixed width W2 in the cross-sectional view taken along the direction in which the lower-layer wiring line 60 extends. The width W2 of each of the interlayer insulating films 80 is equal or substantially equal to a width W1 of an upper-layer wiring line 70.

In the cross-sectional view taken along the direction in which the lower-layer wiring line 60 extends, each of the interlayer insulating films 80 of the second preferred embodiment does not include a portion that has a width that is greater than the width W1 of the upper-layer wiring line 70. Each of the entire interlayer insulating films 80 has the width W2 that is equal to the width W1 of the upper-layer wiring line 70.

As illustrated in FIG. 4, one of the interlayer insulating films 80 includes a top surface 84 that is in contact with the upper-layer wiring line 70 and a bottom surface 85 that is in contact with the lower-layer wiring line 60. In the three-dimensional crossing area 90 in which the upper-layer wiring line 70 and the lower-layer wiring line 60 cross each other, the top surface 84 and the bottom surface 85 each have a flat or substantially flat shape. In the three-dimensional crossing area 90, the top surface 84 and the bottom surface 85 preferably have the same or substantially the same shape and thus have an equal or substantially equal area. The bottom surface of the upper-layer wiring line 70, that is, a surface of the upper-layer wiring line 70 that faces a surface 20a of a piezoelectric substrate 20 is entirely in surface-contact with the top surface 84 of the interlayer insulating film 80 in the three-dimensional crossing area 90.

In the surface acoustic wave filter 11 of the second preferred embodiment, which has been described above, the entire interlayer insulating film 80 preferably has the width W2, which is equal or substantially equal to the width W1 of the upper-layer wiring line 70. As a result, as illustrated in FIG. 5, the interlayer insulating film 80 does not project out from the upper-layer wiring line 70 and cannot be visually recognized when seen in plan view. As a result, the amount of the interlayer insulating film 80 that is arranged so as to cover the lower-layer wiring line 60 is further reduced, and thus, the value of a parasitic capacitance between the lower-layer wiring line 60 and the upper-layer wiring line 70 is further reduced. In addition, since the entire bottom surface of the upper-layer wiring line 70 is in contact with the interlayer insulating film 80, the adhesive strength between the upper-layer wiring line 70 and the interlayer insulating film 80 is improved, and an occurrence of separation of the upper-layer wiring line 70 and the interlayer insulating film 80 is prevented.

A non-limiting example of a process of manufacturing the surface acoustic wave filter 11 of the second preferred embodiment will now be described mainly focusing on formation of the three-dimensional crossing areas 90.

First, a 42° Y-cut LiTaO₃ substrate is prepared as the piezoelectric substrate 20. A first elastic wave filter 21, a second elastic wave filter 22 and the lower-layer wiring line 60, which include main electrodes formed of Al and Cu films and an adhesion layer formed of Ti film, are formed on the surface 20a of the piezoelectric substrate 20. As a formation method, similarly to as in the first preferred embodiment, a lift-off method or a dry etching method is used.

Next, a $SiO_2$ film is deposited by sputtering as the interlayer insulating film 80. The $SiO_2$ film is removed by dry etching except for a portion of the $SiO_2$ film that is at a position on the lower-layer wiring line 60 at which the lower-layer wiring line 60 and the upper-layer wiring line 70 are desired to three-dimensionally cross each other.

Subsequently, the upper-layer wiring line 70 that is formed of a Ti and Al multilayer film is formed by using a lift-off method. In this case, a portion of the upper-layer wiring line 70 is formed in such a manner as to extend on the interlayer insulating film 80 and cross the lower-layer wiring line 60. The line width of the upper-layer wiring line 70 in this case is set to be equal to the width of the interlayer insulating film 80.

After that, the interlayer insulating film 80 is removed by dry etching using $CF_4$ gas while the upper-layer wiring line 70 is serving as a mask.

As a result, the three-dimensional crossing area 90, which is illustrated in FIGS. 4 and 5 and in which the lower-layer wiring line 60 and the upper-layer wiring line 70 three-dimensionally cross each other with the interlayer insulating film 80 interposed therebetween, is formed. As illustrated in FIG. 4, the shape in which the width W2 of the interlayer insulating film 80 is equal to the width W1 of the upper-layer wiring line 70 in the cross-sectional view taken along the direction in which the lower-layer wiring line 60 extends is preferably formed through the process of the dry etching performed on the interlayer insulating film 80. Since the interlayer insulating film 80 is formed by dry etching, the shape of the interlayer insulating film 80 is stabilized, and thus, variations in a parasitic capacitance value and variations in the characteristics of the surface acoustic wave filter 11 are significantly reduced.

Third Preferred Embodiment

Figure 6:
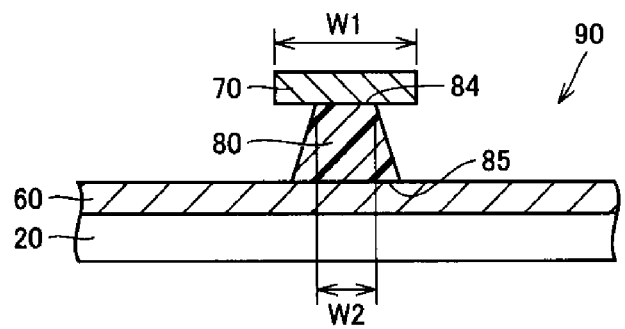
FIG. 6 is a sectional view of a three-dimensional crossing area in a surface acoustic wave filter of a third preferred embodiment of the present invention taken along a direction in which a lower-layer wiring line extends.

FIG. 6 is a sectional view of one of three-dimensional crossing areas 90 in a surface acoustic wave filter 11 of a third preferred embodiment of the present invention taken along a direction in which a lower-layer wiring line 60 extends. In the third preferred embodiment, in the cross-sectional view taken along the direction in which the lower-layer wiring line 60 extends, which is illustrated in FIG. 6, a top surface 84 of an interlayer insulating film 80 has a width W2 that is smaller than a width W1 of an upper-layer wiring line 70. Similarly, a bottom surface 85 of the interlayer insulating film 80 has a width that is smaller than the width W1 of the upper-layer wiring line 70. Therefore, the entire interlayer insulating film 80 has a width that is smaller than the width W1 of the upper-layer wiring line 70.

In the three-dimensional crossing area 90, the bottom surface 85 of the interlayer insulating film 80 has a width that is greater than that of the top surface 84. The cross section of the interlayer insulating film 80 illustrated in FIG. 6 preferably has a trapezoidal or substantially trapezoidal shape in which an upper base is smaller than a lower base.

In the surface acoustic wave filter 11 of the third preferred embodiment, the amount of the interlayer insulating film 80 that is interposed between the lower-layer wiring line 60 and the upper-layer wiring line 70 is further reduced, and the area of a portion of the interlayer insulating film 80 that has been replaced by air is increased compared with the second preferred embodiment illustrated in FIG. 4. As a result, the value of a parasitic capacitance between the lower-layer wiring line 60 and the upper-layer wiring line 70 is further reduced compared with the second preferred embodiment.

Fourth Preferred Embodiment

Figure 7:
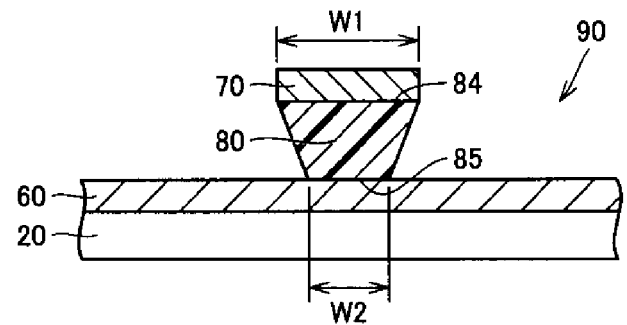
FIG. 7 is a sectional view of a three-dimensional crossing area in a surface acoustic wave filter of a fourth preferred embodiment of the present invention taken along a direction in which a lower-layer wiring line extends.

FIG. 7 is a sectional view of one of three-dimensional crossing areas 90 in a surface acoustic wave filter 11 of a fourth preferred embodiment of the present invention taken along a direction in which a lower-layer wiring line 60 extends. In the fourth preferred embodiment, in the cross-sectional view taken along the direction in which the lower-layer wiring line 60 extends, which is illustrated in FIG. 7, a bottom surface 85 of an interlayer insulating film 80 has a width W2 that is smaller than a width W1 of an upper-layer wiring line 70. A top surface 84 of the interlayer insulating film 80 has a width that is equal or substantially equal to the width W1 of the upper-layer wiring line 70. Therefore, the entire interlayer insulating film 80 has a width that is not greater than the width W1 of the upper-layer wiring line 70.

In the three-dimensional crossing area 90, the top surface 84 of the interlayer insulating film 80 has a width that is greater than that of the bottom surface 85. The cross section of the interlayer insulating film 80 illustrated in FIG. 7 preferably has a trapezoidal or substantially trapezoidal shape in which a lower base is smaller than an upper base.

In the surface acoustic wave filter 11 of the fourth preferred embodiment, the amount of the interlayer insulating film 80 that is interposed between the lower-layer wiring line 60 and the upper-layer wiring line 70 is further reduced, and the area of a portion of the interlayer insulating film 80 that has been replaced by air is increased compared with the second preferred embodiment illustrated in FIG. 4. As a result, the value of a parasitic capacitance between the lower-layer wiring line 60 and the upper-layer wiring line 70 is further reduced compared with the second preferred embodiment.

In the surface acoustic wave filter 11 of the fourth preferred embodiment, the area of a portion of the bottom surface of the upper-layer wiring line 70 that is in contact with the interlayer insulating film 80 is larger compared with the third preferred embodiment illustrated in FIG. 6. As a result, an area over which the upper-layer wiring line 70 and the interlayer insulating film 80 are in contact with each other is secured, and thus, the adhesive strength between the upper-layer wiring line and the interlayer insulating film 80 is improved, and the occurrence of separation of the upper-layer wiring line 70 and the interlayer insulating film 80 is prevented.

Fifth Preferred Embodiment

Figure 8:
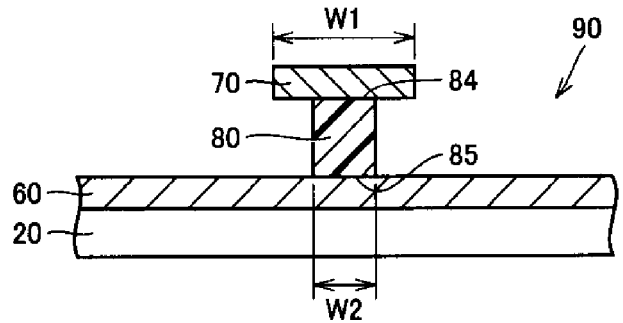
FIG. 8 is a sectional view of a three-dimensional crossing area in a surface acoustic wave filter of a fifth preferred embodiment of the present invention taken along a direction in which a lower-layer wiring line extends.

FIG. 8 is a sectional view of one of three-dimensional crossing areas 90 in a surface acoustic wave filter 11 of a fifth preferred embodiment of the present invention taken along a direction in which a lower-layer wiring line 60 extends. In the fifth preferred embodiment, in the cross-sectional view taken along the direction in which the lower-layer wiring line 60 extends, which is illustrated in FIG. 8, a top surface 84 of an interlayer insulating film 80 has a width W2 that is smaller than a width W1 of an upper-layer wiring line 70. Similarly, a bottom surface 85 of the interlayer insulating film 80 has a width that is smaller than the width W1 of the upper-layer wiring line 70.

In the cross-sectional view taken along the direction in which the lower-layer wiring line 60 extends, the width W2 of the interlayer insulating film 80 of the fifth preferred embodiment is constant. The width W2 of the interlayer insulating film 80 is smaller than the width W1 of the upper-layer wiring line 70. Therefore, the entire interlayer insulating film 80 has a width that is smaller than the width W1 of the upper-layer wiring line 70.

In the surface acoustic wave filter 11 of the fifth preferred embodiment, the amount of the interlayer insulating film 80 that is interposed between the lower-layer wiring line 60 and the upper-layer wiring line 70 is further reduced, and the area of a portion of the interlayer insulating film 80 that has been replaced by air is increased compared with the third preferred embodiment illustrated in FIG. 6 and the fourth preferred embodiment illustrated in FIG. 7. As a result, the value of a parasitic capacitance between the lower-layer wiring line 60 and the upper-layer wiring line 70 is further reduced compared with the third and fourth preferred embodiments.

Sixth Preferred Embodiment

Figure 9:
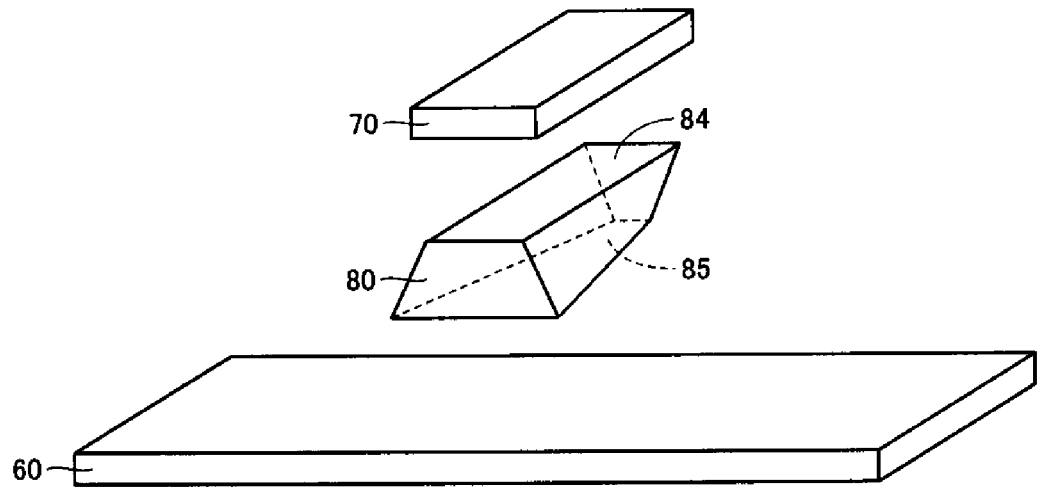
FIG. 9 is an exploded perspective view of a three-dimensional crossing area in a surface acoustic wave filter of a sixth preferred embodiment of the present invention.
Figure 10:
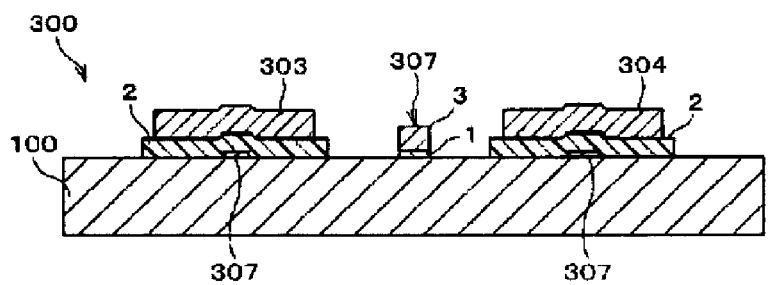
FIG. 10 is a sectional view of a three-dimensional crossing area in a surface acoustic wave filter of the related art.

FIG. 9 is an exploded perspective view of one of three-dimensional crossing areas 90 in a surface acoustic wave filter 11 of a sixth preferred embodiment of the present invention. In the above preferred embodiments, the cross-sectional shape of an interlayer insulating film 80 has been described with reference to the cross-sectional view taken along the direction in which the lower-layer wiring line 60 extends. In a line width direction of the lower-layer wiring line 60, that is, in the direction in which an upper-layer wiring line 70 extends, the cross-sectional shape of the interlayer insulating film 80 need not be uniform and there may be variations in the cross-sectional shape of the interlayer insulating film 80.

In the example illustrated in FIG. 9, the interlayer insulating film 80 preferably has a rectangular or substantially rectangular top surface 84. On the other hand, a bottom surface of the interlayer insulating film 80 preferably has a trapezoidal or substantially trapezoidal shape. Therefore, the area of the cross-sectional shape of the interlayer insulating film 80 along the direction in which the lower-layer wiring line extends gradually decreases from the proximal side to the distal side as viewed in FIG. 9. The interlayer insulating film may have a shape that is obtained by three-dimensionally combining the cross-sectional shapes, which have been described in the first to fifth preferred embodiments, in a region in which the interlayer insulating film 80 covers the lower-layer wiring line 60.

Even in the case where the interlayer insulating film 80 has such a shape, the above-described advantageous effect of reducing a parasitic capacitance value is obtained as long as the interlayer insulating film 80 has a portion that has a width that is not greater than a width W1 of the upper-layer wiring line 70 in any of the cross-sectional views taken along the direction in which the lower-layer wiring line 60 extends.

Although the preferred embodiments of the present invention have been described above, the configurations of the preferred embodiments may be suitably combined. The preferred embodiments disclosed herein are examples in all respects, and the present invention is not to be considered limited to the preferred embodiments. The scope of the present invention is to be determined not by the above description, but by the claims, and it is intended that meanings equal to the claims and all the modifications within the scope of the claims are included in the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave filter comprising:
   a piezoelectric substrate;
   a lower-layer wiring line that is disposed on the piezoelectric substrate;
   an upper-layer wiring line that crosses the lower-layer wiring line and has a potential that is different from a potential of the lower-layer wiring line; and
   an interlayer insulating film that is disposed between the lower-layer wiring line and the upper-layer wiring line; wherein
   the interlayer insulating film includes a portion that has a width that is not greater than a width of the upper-layer wiring line in a cross-sectional view taken along a direction in which the lower-layer wiring line extends.

2. The surface acoustic wave filter according to claim 1, wherein an entirety of the interlayer insulating film has a width that is not greater than the width of the upper-layer wiring line in the cross-sectional view taken along the direction in which the lower-layer wiring line extends.

3. The surface acoustic wave filter according to claim 1, wherein
   the interlayer insulating film includes a top surface that is in contact with the upper-layer wiring line and a bottom surface that is in contact with the lower-layer wiring line; and
   the top surface has a width that is smaller than the width of the upper-layer wiring line in the cross-sectional view taken along the direction in which the lower-layer wiring line extends.

4. The surface acoustic wave filter according to claim 3, wherein the bottom surface has a width that is larger than the width of the top surface in the cross-sectional view taken along the direction in which the lower-layer wiring line extends.

5. The surface acoustic wave filter according to claim 3, wherein the bottom surface has a width that is smaller than the width of the upper-layer wiring line in the cross-sectional view taken along the direction in which the lower-layer wiring line extends.

6. The surface acoustic wave filter according to claim 1, wherein
   the interlayer insulating film includes a top surface that is in contact with the upper-layer wiring line and a bottom surface that is in contact with the lower-layer wiring line; and
   the top surface has a width that is larger than a width of the bottom surface in the cross-sectional view taken along the direction in which the lower-layer wiring line extends.

7. The surface acoustic wave filter according to claim 1, further comprising first and second elastic wave filters connected to each other by interstage connection wiring lines.

8. The surface acoustic wave filter according to claim 1, wherein the lower-layer wiring line is defined by ground wiring lines.

9. The surface acoustic wave filter according to claim 1, wherein the upper-layer wiring line is defined by an input signal wiring line, an output signal wiring line, ground wiring lines, and interstage connection wiring lines.

10. The surface acoustic wave filter according to claim 1, wherein portions of the upper-layer wiring line and the piezoelectric substrate are isolated from each other.

11. The surface acoustic wave filter according to claim 1, further comprising a ground wiring line and an input signal wiring line arranged to cross each other in a three-dimensional crossing area.

12. The surface acoustic wave filter according to claim 11, wherein the interlayer insulating film is disposed between the ground wiring line and the input signal wiring line in a thickness direction of the piezoelectric substrate.

13. The surface acoustic wave filter according to claim 1, further comprising a ground wiring line and an output signal wiring line arranged to cross each other in a three-dimensional crossing area.

14. The surface acoustic wave filter according to claim 13, wherein the interlayer insulating film is disposed between the ground wiring line and the output signal wiring line in a thickness direction of the piezoelectric substrate.

15. The surface acoustic wave filter according to claim 1, wherein interlayer insulating film has a shape that is one of trapezoidal, substantially trapezoidal, rectangular, or substantially rectangular.

16. The surface acoustic wave filter according to claim 1, wherein interlayer insulating film includes an inclined surface.

17. The surface acoustic wave filter according to claim 1, wherein an air space that has a dielectric constant that is smaller than that of the interlayer insulating film is provided between the lower-layer wiring line and the upper-layer wiring line, and the lower-layer wiring line and the upper-layer wiring line face each other and cross each other with the air space defined therebetween.

* * * * *